US011434567B2

(12) United States Patent
LaVoie et al.

(10) Patent No.: US 11,434,567 B2
(45) Date of Patent: Sep. 6, 2022

(54) SUBSTRATE PROCESSING SYSTEM WITH TANDEM SOURCE ACTIVATION FOR CVD

(71) Applicant: LAM RESEARCH CORPORATION, Fremont, CA (US)

(72) Inventors: Adrien LaVoie, Newberg, OR (US); Hu Kang, Tualatin, OR (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 25 days.

(21) Appl. No.: 16/806,560

(22) Filed: Mar. 2, 2020

(65) Prior Publication Data
US 2020/0199747 A1 Jun. 25, 2020

Related U.S. Application Data

(62) Division of application No. 15/667,980, filed on Aug. 3, 2017, now Pat. No. 10,577,688, which is a division
(Continued)

(51) Int. Cl.
*C23C 16/455* (2006.01)
*C23C 16/40* (2006.01)
(Continued)

(52) U.S. Cl.
CPC ........ *C23C 16/4554* (2013.01); *C23C 16/401* (2013.01); *C23C 16/455* (2013.01);
(Continued)

(58) Field of Classification Search
CPC ........ C23C 16/45542; C23C 16/45538; C23C 16/517; C23C 16/455; C23C 16/45536
See application file for complete search history.

(56) References Cited

U.S. PATENT DOCUMENTS 5,242,561 A 9/1993 Sato
5,380,566 A 1/1995 Robertson et al.
(Continued)

FOREIGN PATENT DOCUMENTS

EP 0399676 A1 11/1990
JP 07-335570 A 12/1995

OTHER PUBLICATIONS

U.S. Appl. No. 13/854,497.
(Continued)

*Primary Examiner* — Joseph A Miller, Jr.
(74) *Attorney, Agent, or Firm* — Harness, Dickey & Pierce, P.L.C.

(57) ABSTRACT

A substrate processing system includes a first power source configured to supply plasma having a first power level, a second power source configured to supply plasma having a second power level greater than the first power level, and a controller configured to dose a process chamber with precursor. The first power level is sufficient to enhance adsorption of the precursor on a surface of a substrate and is insufficient to decompose the precursor that is adsorbed. The controller is further configured to remove a portion of the precursor that does not adsorb onto the substrate from the process chamber while the plasma having the first power level is being supplied and activate the precursor that is adsorbed using plasma having the second power level while the plasma having the first power level is still being supplied. The second power level is sufficient to decompose the precursor that is adsorbed.

19 Claims, 6 Drawing Sheets

Related U.S. Application Data of application No. 14/837,612, filed on Aug. 27, 2015, now Pat. No. 9,738,972, which is a division of application No. 14/060,075, filed on Oct. 22, 2013, now Pat. No. 9,145,607.

(51) Int. Cl.
  *C23C 16/507* (2006.01)
  *C23C 16/509* (2006.01)
  *C23C 16/517* (2006.01)

(52) U.S. Cl.
  CPC .. *C23C 16/45536* (2013.01); *C23C 16/45538* (2013.01); *C23C 16/45542* (2013.01); *C23C 16/507* (2013.01); *C23C 16/509* (2013.01); *C23C 16/517* (2013.01)

(56) References Cited

U.S. PATENT DOCUMENTS

| | | |
|---|---|---|
| 6,383,576 B1 | 5/2002 | Matsuyama |
| 6,503,330 B1 | 1/2003 | Sneh et al. |
| 6,821,577 B2 | 11/2004 | Rossman |
| 6,905,737 B2 | 6/2005 | Verplancken et al. |
| 7,011,866 B1 | 3/2006 | Yamanaka et al. |
| 7,871,676 B2 | 1/2011 | Chiang et al. |
| 8,129,290 B2 | 3/2012 | Balseanu et al. |
| 9,194,045 B2 | 11/2015 | Wu et al. |
| 2002/0076490 A1 | 6/2002 | Chiang et al. |
| 2002/0096257 A1* | 7/2002 | Wang .................. C23C 16/507 156/345.48 |
| 2002/0168553 A1 | 11/2002 | Lee et al. |
| 2004/0092132 A1 | 5/2004 | Doan et al. |
| 2004/0191413 A1 | 9/2004 | Park et al. |
| 2005/0255257 A1 | 11/2005 | Choi et al. |
| 2005/0279282 A1* | 12/2005 | Park ....................... C23C 16/34 118/723 MP |
| 2006/0210723 A1* | 9/2006 | Ishizaka ............ C23C 16/45574 427/569 |
| 2007/0026540 A1 | 2/2007 | Nooten et al. |
| 2007/0245962 A1 | 10/2007 | Choi |
| 2008/0241382 A1 | 10/2008 | Clark |
| 2008/0241419 A1 | 10/2008 | Chua et al. |
| 2008/0241420 A1 | 10/2008 | Dhindsa et al. |
| 2009/0041950 A1 | 2/2009 | Mizuno et al. |
| 2009/0162698 A1 | 6/2009 | Fukuzawa et al. |
| 2010/0068881 A1 | 3/2010 | Kang et al. |
| 2011/0048924 A1 | 3/2011 | Freeborn et al. |
| 2011/0151142 A1 | 6/2011 | Seamons et al. |
| 2011/0256726 A1 | 10/2011 | LaVoie et al. |
| 2011/0256734 A1 | 10/2011 | Hausmann et al. |
| 2012/0028454 A1 | 2/2012 | Swaminathan et al. |
| 2012/0171855 A1 | 7/2012 | Ward et al. |
| 2015/0110968 A1 | 4/2015 | LaVoie et al. |

OTHER PUBLICATIONS http://photonicswiki.org/index.php?title=Atomic_Layer_Deposition_ALD; pp. 1-6; Jul. 13, 2009.

http://www.tue.nl/universiten/faculteiten/faculteit-tn/onderzoek/onderzoekscluster-plasmas . . . , "Atomic Layer Deposition", University of Technology, 1 page.

Notification of Transmittal of the International Search Report and Written Opinion of the International Searching Authority, International Application No. PCT/US2013/034906, dated Apr. 2, 2013, 13 pages.

Schaepkens, M., et al., "Effects of radio frequency bias frequency and radio frequency bias pulsing on SiO2 feature etching in inductively coupled fluorocarbons plasmas". J. Vac. Sci. Technol. B 18(2), Mar./Apr. 2000, pp. 856-863.

Yin, Y., et al., "The origins of self-bias on dielectric substrates in RF plasma processing". Surface and Coatings Technology 200 (2006) 3670-3674.

Chandhok, Manish, et al., "Modeling the Pressure Dependence of DC Bias Voltage in Asymmetric, Capacitive RF Sheaths". IEEE Transactions on Plasma Science, vol. 26, No. 2, Apr. 1998, pp. 181-189.

Klimes, W., et al., "Gap filling with High Current pulsed arc evaporation : influence of deposition parameters". MAM-97—Materials for Advanced Metallization, Posters session 1, p. 136. Abstract Only.

U.S. Appl. No. 15/667,980, filed Aug. 3, 2017.
U.S. Appl. No. 14/837,612, filed Aug. 27, 2015.
U.S. Appl. No. 14/060,075, filed Oct. 22, 2013.
U.S. Appl. No. 15/667,980, filed Aug. 3, 2017 Adrien LaVoie.
Translation of First Office Action dated Jun. 1, 2020 corresponding to Korean Patent Application No. 10-2014-0142760, 3 pages.
Translation of Second Office Action dated Dec. 6, 2021 corresponding to Korean Patent Application No. 10-2014-0142760, 4 pages.
Translation of Third Office Action dated Jan. 11, 2022 corresponding to Korean Patent Application No. 10-2014-0142760, 4 pages.
Translation of First Office Action dated Dec. 19, 2017 corresponding to Taiwanese Patent Application No. 103136342, 12 pages.
Translation of Notice of Allowance dated Sep. 6, 2018 corresponding to Taiwanese Patent Application No. 103136342, 2 pages.
Translation of Notice of Allowance dated Jul. 17, 2019 corresponding to Taiwanese Patent Application No. 107135036, 2 pages.

* cited by examiner

SUBSTRATE PROCESSING SYSTEM WITH TANDEM SOURCE ACTIVATION FOR CVD

CROSS-REFERENCE TO RELATED APPLICATIONS

The present disclosure is a divisional of U.S. patent application Ser. No. 15/667,980, filed Aug. 3, 2017, which is a divisional of U.S. patent application Ser. No. 14/837,612 (now U.S. Pat. No. 9,738,972), filed on Aug. 27, 2015, which is a divisional of U.S. patent application Ser. No. 14/060,075 (now U.S. Pat. No. 9,145,607), filed on Oct. 22, 2013. The entire disclosures of the applications referenced above are incorporated herein by reference.

FIELD

The present disclosure relates to substrate processing systems, and more particularly to cyclical deposition such as atomic layer deposition or pulsed chemical vapor deposition of films.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

FIG. 1 shows an example of a method 10 for performing atomic layer deposition (ALD) of $SiO_2$ via reaction of silicon precursors with oxidizing co-reactants (ozone, oxidizing plasmas, etc.). Inert and/or reaction gases may be introduced into a process chamber. At 12, a precursor dose is introduced into the process chamber. Some of the precursor is adsorbed onto an exposed surface of the substrate and remaining precursor is removed from the process chamber at 14. For example, the substrate may include a semiconductor wafer. At 16, the adsorbed precursor is activated, typically using plasma. At 20, post activation removal of reactants is performed.

ALD processing may tend to have relatively long cycle times due to the amount of time required for the precursor to adsorb onto the exposed surface of the substrate. Contamination may occur due to the transients caused by cycling of the plasma on (during activation of the adsorbed precursor) and off (during dosing of the precursor).

SUMMARY

A method for processing a substrate in a substrate processing system includes a) flowing reactant gases into a process chamber; b) supplying plasma having a first power level; c) dosing the process chamber with the precursor, wherein the first power level is sufficient to enhance adsorption of the precursor on a surface of the substrate, and wherein the first power level is insufficient to decompose the precursor that is adsorbed; d) after a first predetermined period, removing a portion of the precursor that does not adsorb onto the substrate; e) activating the precursor that is adsorbed using plasma having a second power level, wherein the second power level is greater than the first power level and is sufficient to decompose the precursor that is adsorbed; and f) removing reactants from the process chamber.

In other features, the first power level is supplied from (b) to (f). The first power level is supplied during (c) and not during (e). The first power level is terminated after the second power level is supplied and the first power level is supplied prior to the second power level being terminated. The first power level is supplied by an inductively coupled plasma source and the second power level is supplied by a capacitively coupled plasma source. The first power level is supplied from (b) to (f).

In other features, the first power level is supplied by a capacitively coupled plasma source and the second power level is supplied by the capacitively coupled plasma source. The first power level is supplied from (b) to (f). The first power level is supplied by an inductively coupled plasma source and the second power level is supplied by the inductively coupled plasma source. The first power level is supplied by a remote plasma source and the second power level is supplied by a capacitively coupled plasma source. The first power level is below a threshold to permit significant parasitic chemical vapor deposition (CVD) and above a threshold to permit low energy activation of the precursors without destruction.

A method for processing a substrate in a substrate processing system includes a) flowing reactant gases into a process chamber including a substrate; b) supplying a first power level that is sufficient to promote rearrangement of molecules on a surface of the substrate; c) waiting a first predetermined period; d) after the first predetermined period, performing plasma-enhanced, pulsed chemical vapor deposition of film on the substrate by supplying one or more precursors while supplying a second power level for a second predetermined period, wherein the second power level is greater than the first power level; and e) removing reactants from the process chamber.

In other features, the first power level is supplied from (b) to (e). The first power level is supplied during (b) and (c) and not during (d). The first power level is terminated after the second power level is supplied and the first power level is supplied prior to the second power level being terminated. The first power level is supplied by an inductively coupled plasma source and the second power level is supplied by a capacitively coupled plasma source. The first power level is supplied from (b) to (e). The first power level is supplied by a capacitively coupled plasma source and the second power level is supplied by the capacitively coupled plasma source. The first power level is supplied from (b) to (e). The first power level is supplied by an inductively coupled plasma source and the second power level is supplied by the inductively coupled plasma source. The first power level is supplied by a remote plasma source and the second power level is supplied by a capacitively coupled plasma source. The first power level is supplied by a UV source.

A substrate processing system for processing a substrate includes plasma source. A controller is configured to flow reactant gases into a process chamber; dose the process chamber with precursor while the plasma source supplies plasma having a first power level, wherein the first power level is sufficient to enhance adsorption of the precursor on a surface of the substrate, and wherein the first power level is insufficient to decompose the precursor that is adsorbed; after a first predetermined period, remove a portion of the precursor that does not adsorb onto the substrate; activate the precursor that is adsorbed using plasma having a second power level, wherein the second power level is greater than the first power level and is sufficient to decompose the precursor that is adsorbed; and removing reactants from the process chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure relates to systems and methods for depositing film using a cyclical deposition process such as but not limited to atomic layer deposition (ALD) or pulsed chemical vapor deposition (CVD). In some examples, the ALD and pulsed CVD may be used to perform conformal film deposition (CFD). Additional details relating to CFD may be found in commonly-assigned U.S. Pat. Nos. 6,905,737 and 7,871,676, which are hereby incorporated by reference in their entirety.

For example only, while the description set forth below relates to dual precursor activation for ALD using inductively coupled plasma (ICP), capacitively coupled plasma (CCP) or ultraviolet (UV) energy in combination with low energy ICP or CCP, other processes such as pulsed CVD and other activation methods such as using remote plasma sources can be used. As can be appreciated, the remote plasma may be introduced via a showerhead or other methods.

The different activation methods are capable of promoting molecules to different energy states to motivate different molecular activity. In one example, a first activation source promotes precursor molecules to have increased surface adsorption, which decreases dose time and increases throughput. A second activation source is applied sequentially to decompose the surface adsorbed precursor molecule in a manner consistent with standard plasma enhanced processing. For example only, the first activation source may remain ON during the entire process. For example only, the first activation source may use low RF power such as CCP=200 W split by 4 pedestals. Processing in this manner may occur in a cyclical fashion.

The dual activation approach for processing of thin films is expected to provide kinetic improvement for the adsorption step. The dual activation approach is expected to reduce particles due to elimination of sharp transients from abrupt plasma transitions when turning the plasma ON and turning the plasma OFF. The improved surface mobility of activated precursors may be amenable to reflow and therefore gap fill applications can be supported. In addition, the activated precursors may overcome the relatively high dose time hurdles for existing ALD processes (such as SIN and SiC). The dual activation approach is also amenable to halide free processing.

Figures 1, 2:
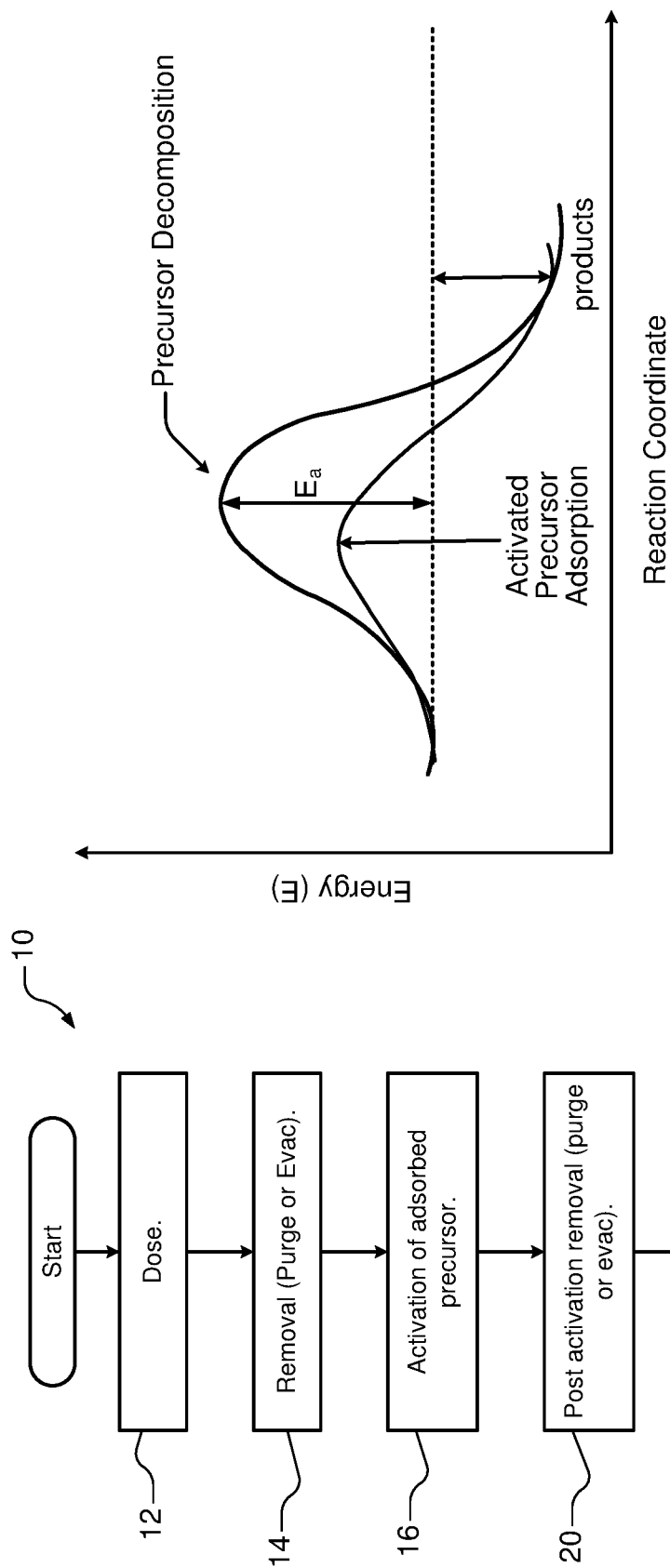
FIG. 1 is an example of a method for performing atomic layer deposition (ALD) according to the prior art.
FIG. 2 is a graph illustrating activation energy during deposition according to the present disclosure.

FIG. 2 shows an example of an energy profile depicting a dual source activation method for ALD. In some examples, continuous activation is employed during the ALD cycle. The continuous activation may include remote plasma, inductively coupled plasma (ICP) or capacitively coupled plasma (CCP), or ultraviolet (UV) energy in combination with ICP or CCP. The power magnitude is varied over time. For example only, first and second power levels may be used during the ALD cycle.

In one example, a first RF power level is used during both dosing of the precursor and removal (e.g. purging or evacuation) of the precursor. The first RF power level is (1) below a threshold to permit significant parasitic chemical vapor deposition (CVD) and/or (2) adequate to permit low energy activation of the precursors without destruction.

Parasitic CVD or PECVD may be caused by interaction of co-reactants in the gas phase or interaction of plasma with a precursor in the gas phase. This would result in CVD or PECVD with mass-transport limited delivery of materials in a directional sense to the substrate. As used herein, significant parasitic CVD or PECVD may refer to with-in-wafer (WIW) non-uniformity (NU) greater than 2% 1-sigma (or WIW NU>2% 1 s) and reduced step coverage (<90% sidewall to field thickness).

After dosing of the precursor and removal of the precursor, plasma having a second RF power level is used during activation to decompose the adsorbed precursor. Plasma having the second RF power level is above a threshold energy of activation ($E_a$) to decompose the precursor. The second RF power level may be supplied by the remote plasma source, the CCP power source, the ICP power source or another power source. As can be appreciated, a first RF power source providing the first RF power level may be turned ON and OFF or the first RF power source may remain on before and during operation of the second RF power source.

The first RF power level increases the energy of the precursor to a state that is sufficient to promote interaction with a substrate surface that is at a lower energy state and thus enhanced adsorption occurs while avoiding decomposition of the adsorbed precursor. The second RF power level is then used to decompose the surface adsorbed precursor and complete the reaction.

Figure 3:
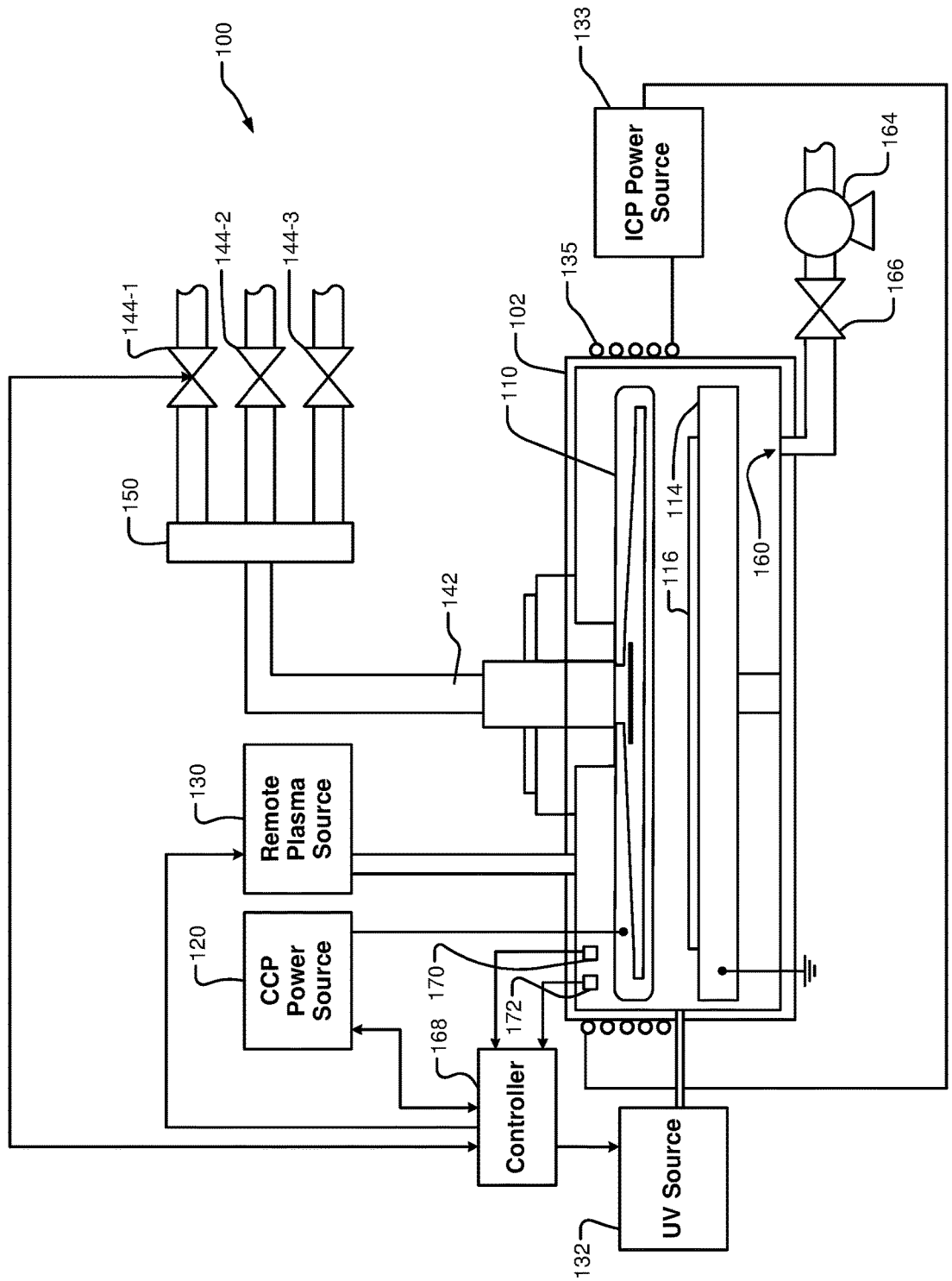
FIG. 3 is a functional block diagram of an example of a substrate processing system according to the present disclosure.

FIG. 3 shows an example of a substrate processing system 100 that includes a process chamber 102. The substrate processing system 100 further includes a showerhead 110 to deliver process gases to the process chamber 102.

A pedestal 114 may be connected to a reference potential such as ground. Alternatively an electrostatic chuck (ESC) may be used instead of the pedestal. The pedestal 114 may include a chuck, a fork, or lift pins (all not shown) to hold and transfer a substrate 116 during and between deposition and/or plasma treatment reactions. The chuck may be an electrostatic chuck, a mechanical chuck or various other types of chuck.

While FIG. 3 shows multiple RF power sources to create plasma in the process chamber 102 for illustration purposes, it will be understood that one RF power source that is operable at two RF power levels or any combination of two or more RF power sources may be used to supply the first RF power level and the second RF power level. For example only, two or more of a CCP power source, an ICP power source and a remote plasma source can be used.

For example, a CCP power source 120 may be used to supply RF power across the showerhead 110 and a pedestal 114 to create plasma. As can be appreciated, while the pedestal 114 is shown to be grounded, the RF power may be supplied to the pedestal 114 and the showerhead may be grounded. A remote plasma source 130 may provide remotely generated plasma to the process chamber 102 at one or more RF power levels. In some examples, the remote plasma source 130 may use microwave energy and/or a plasma tube. An ultraviolet (UV) source 132 may provide UV activation.

An ICP power source 133 may be used to supply current to a coil 135. When a time-varying current passes through the coil 135, the coil 135 creates a time-varying magnetic field. The magnetic field induces current in gas in the process chamber, which leads to the formation of plasma in the process chamber.

The process gases are introduced to the showerhead 110 via inlet 142. Multiple process gas lines are connected to a manifold 150. The process gases may be premixed or not. Appropriate valves and mass flow controllers (generally identified at 144-1, 144-2, and 144-3) are employed to ensure that the correct gases and flow rates are used during substrate processing. Process gases exit the process chamber 102 via an outlet 160. A vacuum pump 164 typically draws process gases out of the process chamber 102 and maintains a suitably low pressure within the reactor by a flow restriction device, such as a valve 166. A controller 168 may sense operating parameters such as chamber pressure and temperature inside the process chamber using sensors 170 and 172. The controller 168 may control the valves and mass flow controllers 144. The controller 168 may also control the plasma power source 120.

Figure 4:
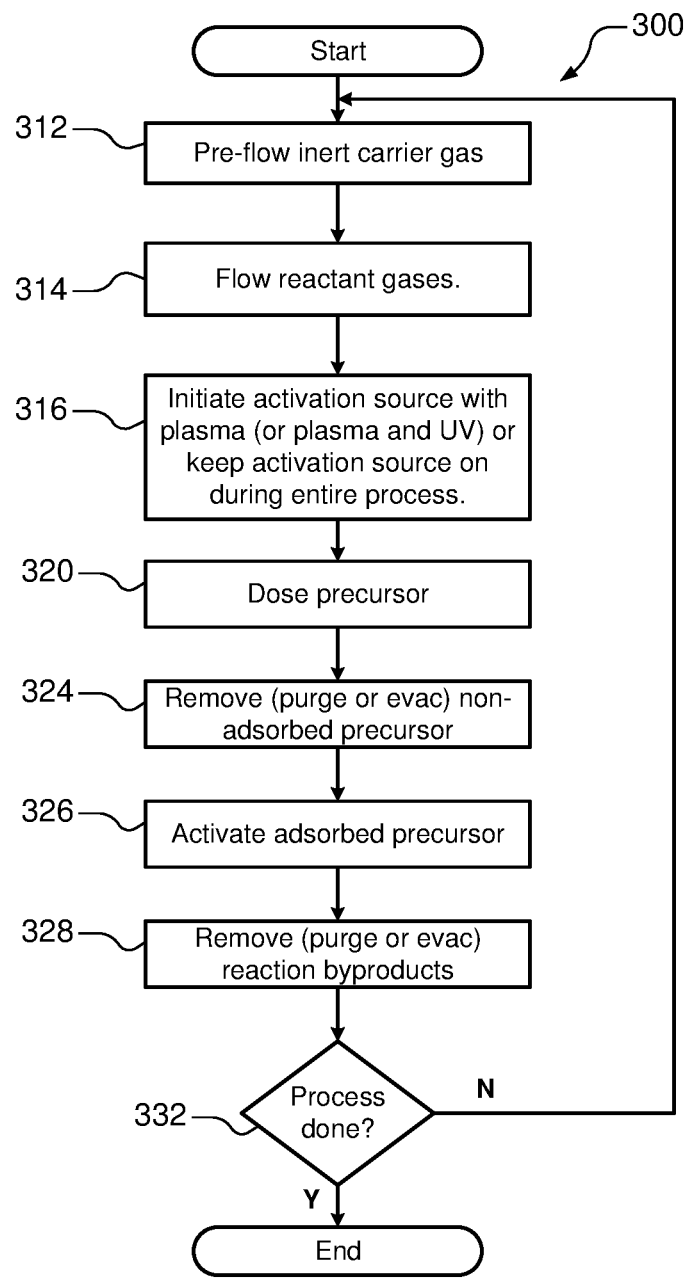
FIG. 4 is an example of a method for performing ALD according to the present disclosure.

FIG. 4 shows an example of a method 300 for performing ALD. At 312, an inert carrier gas is provided in the process chamber. At 314, reactant gases are provided. At 316, an activation source supplying the first RF power level is initiated prior to, at the same time as or soon after dosing of the precursor occurs. The activation source can include supplying the first RF power level using the remote plasma source, the ICP power source or the CCP power source. Additional power may be supplied using the UV source. The first RF power level is (1) below a threshold to permit significant parasitic chemical vapor deposition (CVD) and/or (2) adequate to permit low energy activation of the precursors without destruction or decomposition of the adsorbed precursor.

At 320, a precursor dose may be provided to the process chamber. At 324, the non-adsorbed precursor is removed from the process chamber. At 326, the adsorbed precursor is activated using the second RF power level to decompose the adsorbed precursor. The second RF power level may be supplied by the remote plasma source, the ICP power source or the CCP power source. The first RF power level may still be supplied while the second power level is being supplied. Alternately, the first RF power level may be transitioned off.

The transition OFF may occur in an overlapping manner with a transition ON of the second RF power level to reduce transients. In other words, the second RF power level starts turning ON before or while the first RF power level starts turning off and vice versa.

When activation is complete, the second RF power level is no longer supplied and the RF power is returned to the first RF power level. At 328, reaction by-products are removed. The removal (purging or evacuation) step can occur before, during or after the transition to the first RF power level. At 332, control determines whether the process is done. If 332 is false, control returns to 312 for one or more additional cycles. Otherwise control ends.

Figure 5:
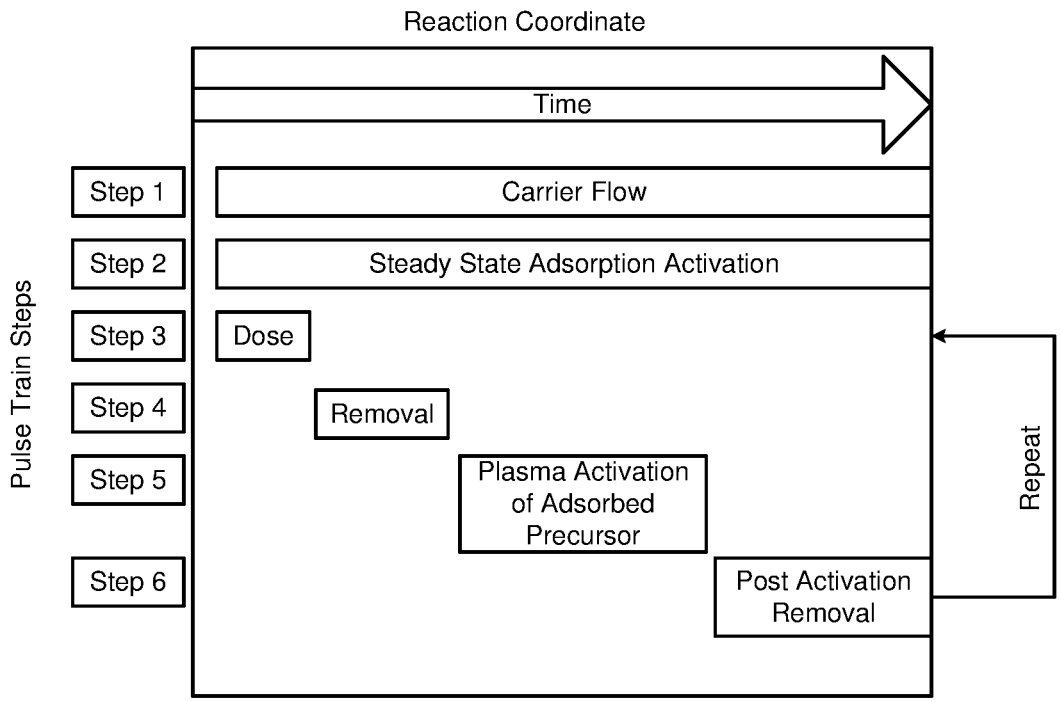
FIG. 5 illustrates examples of pulse train steps during another reaction coordinate according to an example of the present disclosure.
Figure 6:
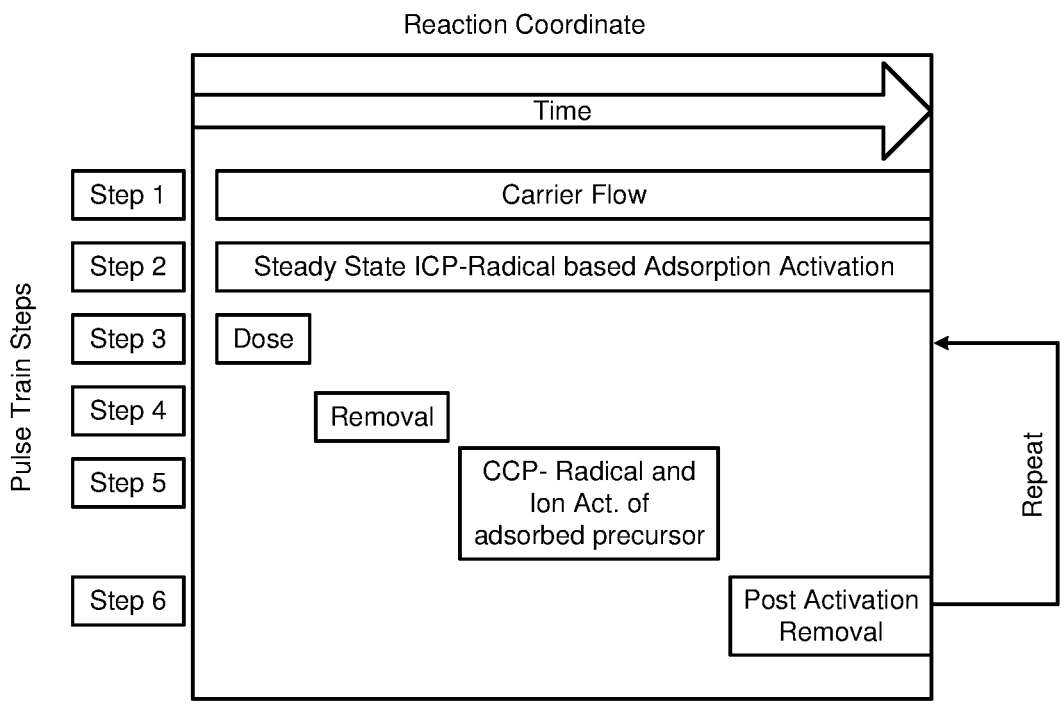
FIG. 6 illustrates examples of pulse train steps during another reaction coordinate according to another example of the present disclosure.
Figure 7:
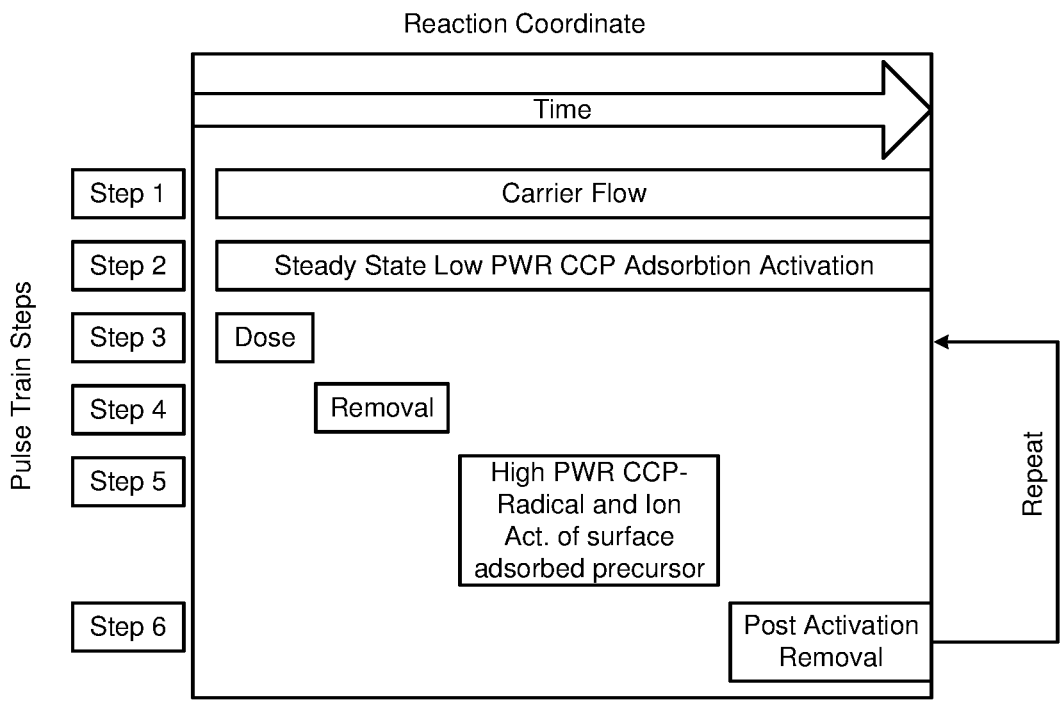
FIG. 7 illustrates examples of pulse train steps during another reaction coordinate according to another example of the present disclosure.

FIGS. 5-7 show various examples of pulse train steps during a reaction coordinate. In FIG. 5, the carrier gas is provided in step 1 to the process chamber during the process. Steady state adsorption activation at the first RF power level is provided in step 2 during the process. In step 3, a precursor dose is provided to the process chamber. In step 4, the precursor that is not adsorbed is removed. At step 5, plasma activation of the adsorbed precursor is performed at the second RF power level. In step 6, a post activation removal of reactants is performed. Steps 3 through 6 may be repeated as desired.

In FIG. 6, the carrier gas is provided in step 1 to the process chamber during the process. Steady-state ICP-radical adsorption activation is provided at the first RF power level in step 2 during the process. In step 3, a precursor dose is provided to the process chamber. In step 4, the precursor that is not adsorbed is removed. At step 5, plasma activation of the adsorbed precursor is performed at the second RF power level using CCP-radical and ion activation of the adsorbed precursor. In step 6, a post activation removal of reactants is performed. Steps 3 through 6 may be repeated as desired.

In FIG. 7, the carrier gas is provided in step 1 to the process chamber during the process. Steady-state low power CCP adsorption activation is provided at the first RF power level in step 2 during the process. In step 3, a precursor dose is provided to the process chamber. In step 4, the precursor that is not adsorbed is removed. At step 5, plasma activation of the adsorbed precursor is performed using high power CCP radical and ion activation of the adsorbed precursor at the second RF power level. In step 6, a post activation removal of reactants is performed. Steps 3 through 6 may be repeated as desired.

Figure 8:
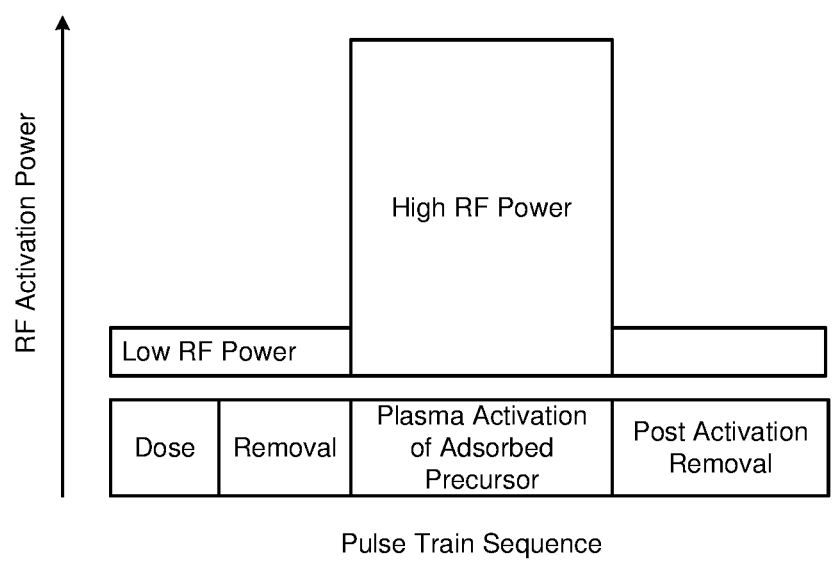
FIG. 8 illustrates RF power during ALD according to the present disclosure.

FIG. 8 illustrates RF power during operation according to the present disclosure. Low RF power is used during dose, removal and post activation removal of reactants steps. High RF power is used during plasma activation of adsorbed precursor.

Figure 9:
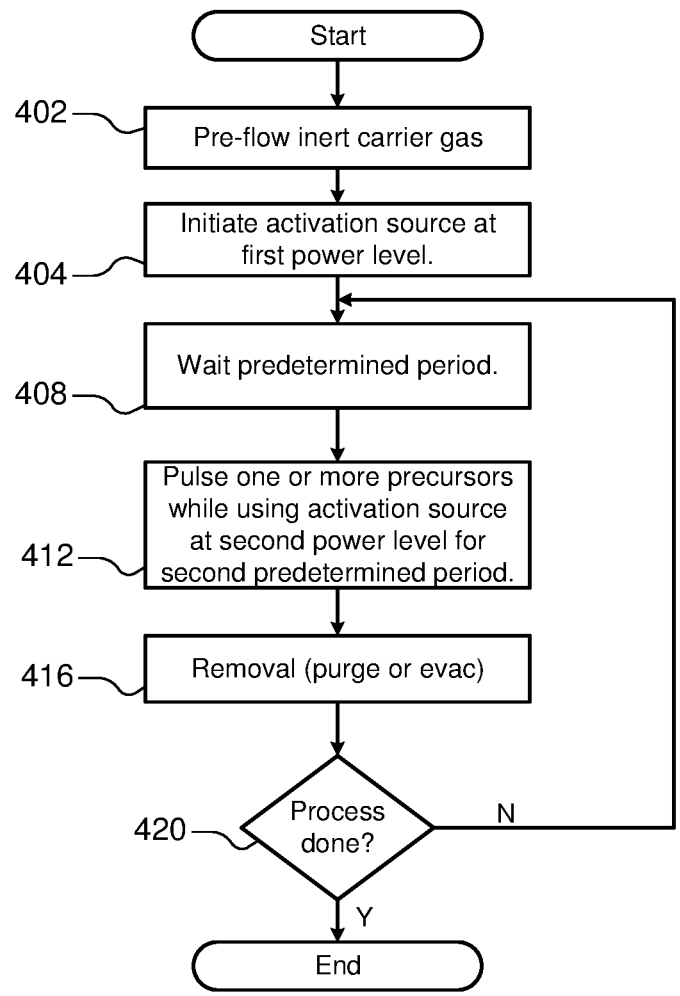
FIG. 9 illustrates an example of a method for performing pulsed CVD according to the present disclosure.

FIG. 9 illustrates an example of a method for performing pulsed CVD according to the present disclosure. At 402, inert carrier gas is provided. At 404, an activation source is initiated at a first power level. At 408, control waits a predetermined period. At 412, one or more precursors are pulsed while using a plasma activation source at a second power level for a second predetermined period. After the second predetermined period, a removal of reactants operation may be performed at 416. At 420, if the process is not done, control returns to 408 and repeats the pulsed CVD. When the process is done, control ends.

In one example, the first RF power level is used before reactants are introduced at 412. The first RF power level is (1) below a threshold to permit significant parasitic chemical vapor deposition (CVD) and/or (2) adequate to permit low energy activation a surface of the substrate. The first energy level may promote cracking of surface molecules and/or movement and rearrangement of molecules on the surface of the substrate. The first power level may be supplied by the UV source or any of the plasma sources listed above.

Plasma having the second RF power level is above a threshold energy of activation ($E_a$). The second RF power level may be supplied by any of the plasma sources listed above. As can be appreciated, a first RF power source providing the first RF power level may be turned ON and OFF or the first RF power source may remain on before and during operation of the second RF power source.

The embodiments herein are not limited to particular reactants or film types. However, an exemplary list of reactants is provided below.

In certain embodiments, the deposited film is a silicon-containing film. In these cases, the silicon-containing reactant may be for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiary-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, bis(n-propylcyclopentadienyl)magnesium, etc.

In some embodiments, the deposited film contains nitrogen, and a nitrogen-containing reactant must be used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

In certain implementations, an oxygen-containing oxidizing reactant is used. Examples of oxygen-containing oxidizing reactants include oxygen, ozone, nitrous oxide, carbon monoxide, etc.

While many examples discussed herein include two reactants (e.g., A and B, or a principal reactant and an auxiliary reactant), it will be appreciated that any suitable number of reactants may be employed within the scope of the present disclosure. In some embodiments, a single reactant and an inert gas used to supply plasma energy for a surface decomposition reaction of the reactant may be used. Alternatively, some embodiments may use three or more reactants to deposit a film.

The embodiments herein may use various different process sequences. Table 1 below recites non-limiting examples of process parameters that may be used to implement this technique to deposit a silicon oxide film.

TABLE 1

|  | Oxidant | Si dose | Purge 1 | RF plasma | Purge 2 |
|---|---|---|---|---|---|
| Compound(s) | $O_2$, $N_2O$, $CO_2$, mixtures, e.g., mixture of $N_2O$ and $O_2$ | Silanes, e.g., BTBAS | Inert gas, e.g., Ar/$N_2$ | NA | Inert gas, e.g., Ar/$N_2$ |
| Flow Rate | 3-10 slm, e.g. 4.5 slm $O_2$ + 5 slm $N_2O$ premixed | 0.5-5 ml/min, e.g., 2 ml/min | 10-90 slm, e.g., 45 slm | NA | 10-90 slm, e.g., 45 slm |

TABLE 1-continued

|  | Oxidant | Si dose | Purge 1 | RF plasma | Purge 2 |
|---|---|---|---|---|---|
| Time | Continuous | 0.1-2 s, e.g., 0.8 s | 0.1-5 s, e.g., 0.5 s | 0.1-5 s, e.g. 1 s | Optional, if performed 0.01-5 s, e.g., 0.09 s |

Table 2 below recites various non-limiting examples of process parameters that may be used to implement this process flow to deposit a silicon oxide film.

TABLE 2

|  | Oxidant | Si dose | Purge 1 | RF plasma | Purge 2 |
|---|---|---|---|---|---|
| Compound(s) | $O_2$, $N_2O$, $CO_2$, mixtures, e.g., mixture of $N_2O$ and $O_2$ | Silanes, e.g. BTBAS | Inert gas, e.g., $Ar/N_2$ | NA | Inert gas, e.g., $Ar/N_2$ |
| Flow Rate | 3-10 slm, e.g. 4.5 slm $O_2$ + 5 slm $N_2O$ premixed | 0.5-5 ml/min, e.g., 2 ml/min | 10-90 slm, e.g., 45 slm | NA | 10-90 slm, e.g., 45 slm |
| Time | 50 ms-5 s, e.g., 0.15 s Concurrent with RF or may flow oxidant 0.001-1 s prior to RF to stabilize flow | 50 ms-1 s. e.g., 0.2 s | Continuous, inert gas only: 0.1-5 s, e.g., 0.4 s | 50 ms-5 s, e.g., 0.15 s | Continuous, inert gas only: Optional, if performed 0.01-5 s, e.g., 0.09 s |

The compounds, flow rates, and dosage times in the above tables are examples. Any appropriate silicon-containing reactant and oxidant may be used for the deposition of silicon oxides. Similarly, for the deposition of silicon nitrides, any appropriate silicon-containing reactant and nitrogen-containing reactant may be used. Further, for the deposition of metal oxides or metal nitrides, any appropriate metal-containing reactants and co-reactants may be used. The techniques herein are beneficial in implementing a wide variety of film chemistries The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

What is claimed is:

1. A substrate processing system for processing a substrate, the substrate processing system comprising:
   a first power source configured to supply plasma having a first power level;
   a second power source configured to supply plasma having a second power level greater than the first power level; and a controller configured to:
dose a process chamber of the substrate processing system with precursor while the first power level is supplied and the second power level is not supplied, wherein the first power level is sufficient to enhance adsorption of the precursor on a surface of the substrate, and wherein the first power level is insufficient to decompose the precursor that is adsorbed,
after a first predetermined period of supplying the first power level, remove a portion of the precursor that does not adsorb onto the substrate from the process chamber while the plasma having the first power level is being supplied from the first power source, and
in a second predetermined period subsequent to the first predetermined period, activate the precursor that is adsorbed using plasma having the second power level supplied from the second power source while the plasma having the first power level is still being supplied from the first power source, wherein the second power level is sufficient to decompose the precursor that is adsorbed.

2. The substrate processing system of claim 1, wherein the controller is configured to supply the first power level from the first power source at a same time as supplying the plasma having the second power level from the second power source in the second predetermined period.

3. The substrate processing system of claim 1, wherein the controller is further configured to control removal of reactants from the process chamber while the plasma having the first power level is still being supplied from the first power source.

4. The substrate processing system of claim 3, wherein the removal of the reactants comprises at least one of purging and evacuating the process chamber.

5. The substrate processing system of claim 1, wherein the controller is configured to repeat the dosing of the process chamber, the removing of the portion of the precursor that does not adsorb, and the activating the precursor to perform atomic layer deposition.

6. The substrate processing system of claim 1, wherein the controller is configured to repeat the dosing of the process chamber, the removing of the portion of the precursor that does not adsorb, and the activating of the precursor to perform a cyclical deposition process.

7. The substrate processing system of claim 1, wherein the first power level is below a first threshold required to permit significant parasitic chemical vapor deposition (CVD) and above a threshold required to permit low energy activation of the precursors without destruction.

8. A substrate processing system for processing a substrate, the substrate processing system comprising:
a first power source configured to supply plasma having a first power level;
a second power source configured to supply plasma having a second power level greater than the first power level; and
a controller configured to
flowing reactant gases into a process chamber including the substrate,
supply, to the process chamber, plasma at the first power level sufficient to promote rearrangement of molecules adsorbed from the reactant gases onto a surface of the substrate, wherein the first power level is supplied in a first predetermined period where (i) the reactant gases are flowing into the process chamber and (ii) the plasma at the second power level is not supplied to the process chamber,
wait a second predetermined period subsequent to flowing the reactant gases and supplying the plasma at the first power level and prior to supplying the plasma at the second power level to the process chamber,
after the second predetermined period, perform plasma-enhanced, pulsed chemical vapor deposition of film on the substrate by supplying one or more precursors while supplying the plasma at the second power level to the process chamber for a third predetermined period, wherein performing the pulsed chemical vapor deposition includes providing a pulse train including a sequence of pulses supplying the one or more precursors while the plasma at the second power level is continuously supplied, and wherein the second power level is greater than the first power level, and
remove reactants from the process chamber,
wherein the controller is configured to terminate supply of the first power level after the second power level is supplied and supply the first power level prior to the supply of the second power level being terminated.

9. The substrate processing system of claim 8, wherein the controller is configured to supply the power at the first power level while waiting the second predetermined period, performing the pulsed chemical vapor deposition, and removing the reactants.

10. The substrate processing system of claim 8, wherein the removal of the reactants comprises at least one of purging and evacuating the process chamber.

11. The substrate processing system of claim 8, wherein the controller is configured to repeat the flowing of the reactant gases, the supply of the plasma at the first power level, the waiting of the second predetermined period, and the performing of the pulsed chemical vapor deposition of film to perform a cyclical deposition process.

12. The substrate processing system of claim 8, wherein the first power level permits low energy activation on a surface of the substrate.

13. The substrate processing system of claim 8, wherein the second power level is above a predetermined threshold, and wherein the predetermined threshold corresponds to a threshold energy of activation.

14. A substrate processing system for processing a substrate, the substrate processing system comprising:
a first power source;
a second power source; and
a controller configured to
flowing reactant gases into a process chamber including the substrate,
supply, to the process chamber, a first power level from the first power source, wherein the first power level is sufficient to promote rearrangement of molecules adsorbed from the reactant gases onto a surface of the substrate, and wherein the first power level is supplied in a first predetermined period where (i) the reactant gases are flowing into the process chamber and (ii) a second power level is not supplied to the process chamber from the second power source,
wait a second predetermined period subsequent to flowing the reactant gases and supplying the first power level and prior to supplying the second power level to the process chamber, after the second predetermined period, perform plasma-enhanced, pulsed chemical vapor deposition of film on the substrate by supplying one or more precursors while supplying the second power level to the process chamber for a third predetermined period, wherein performing the pulsed chemical vapor deposition includes providing a pulse train including a sequence of pulses supplying the one or more precursors while the second power level is continuously supplied, wherein the first power level is less than a predetermined threshold at which significant parasitic chemical vapor deposition occurs, wherein the second power level is greater than the first power level and a second threshold, and wherein the second threshold corresponds to a threshold energy of activation for decomposing the one or more precursors previously adsorbed onto the surface of the substrate, and remove reactants from the process chamber, wherein the controller is configured to terminate supply of the first power level after the second power level is supplied and supply the first power level prior to the supply of the second power level being terminated.

15. The substrate processing system of claim 14, wherein the controller is configured to supply the first power level while waiting the second predetermined period but not while performing the pulsed chemical vapor deposition.

16. The substrate processing system of claim 14, wherein the controller is configured to repeat the supply of the first power level, the waiting of the second predetermined period, and the performing of the pulsed chemical vapor deposition to perform a cyclical deposition process.

17. The substrate processing system of claim 14, wherein the removal of the reactants comprises at least one of purging and evacuating the process chamber.

18. The substrate processing system of claim 14, wherein the first power level promotes further cracking of surface molecules on a surface of the substrate.

19. The substrate processing system of claim 14, wherein the first power level permits low energy activation at 200 W on a surface of the substrate.

* * * * *